(12) United States Patent
Kurosawa et al.

(10) Patent No.: US 8,861,265 B2
(45) Date of Patent: Oct. 14, 2014

(54) SEMICONDUCTOR STORAGE DEVICE AND DATA CONTROL METHOD THEREOF

(75) Inventors: Tomonori Kurosawa, Zama (JP);
Mizuki Kaneko, Yokohama (JP);
Takafumi Shimotori, Kawasaki (JP);
Takayuki Tsukamoto, Yokkaichi (JP);
Yoichi Minemura, Yokkaichi (JP);
Hiroshi Kanno, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 13/597,814

(22) Filed: Aug. 29, 2012

(65) Prior Publication Data

US 2013/0229851 A1 Sep. 5, 2013

(30) Foreign Application Priority Data

Sep. 22, 2011 (JP) ................................. 2011-207869

(51) Int. Cl.
*G11C 13/00* (2006.01)

(52) U.S. Cl.
CPC ........ *G11C 13/0069* (2013.01); *G11C 13/0097* (2013.01); *G11C 13/0064* (2013.01); *G11C 13/0004* (2013.01); *G11C 13/0011* (2013.01); *G11C 2213/72* (2013.01); *G11C 13/0007* (2013.01)
USPC ..................... 365/163; 365/148; 365/189.011

(58) Field of Classification Search
CPC ........... G11C 13/0004; G11C 13/0069; G11C 11/5678; G11C 2213/79; G11C 13/004
USPC .................................. 365/163, 148, 189.011
See application file for complete search history.

(56) References Cited

U.S. PATENT DOCUMENTS

| | | | |
|---|---|---|---|
| 2008/0266942 A1 | 10/2008 | Jeong et al. | |
| 2009/0168504 A1 | 7/2009 | Lee et al. | |
| 2010/0271860 A1 | 10/2010 | Muraoka et al. | |
| 2010/0296338 A1* | 11/2010 | Park et al. | 365/163 |

FOREIGN PATENT DOCUMENTS

| | | |
|---|---|---|
| JP | 2007-4849 | 1/2007 |
| JP | 2008-276928 | 11/2008 |
| JP | 4485605 | 4/2010 |

* cited by examiner

*Primary Examiner* — Jason Lappas
(74) *Attorney, Agent, or Firm* — Oblon, Spivak, McClelland, Maier & Neustadt, L.L.P.

(57) ABSTRACT

In a memory cell array, memory cells each including a variable resistance element are arranged at crossing portions between a plurality of first wiring and a plurality of second wirings. A control circuit executes a set operation, a reset operation, and a training operation. In the set operation, a set pulse is applied to the variable resistance element to change the variable resistance element from a high resistance state to a low resistance state. In the reset operation, a reset pulse having an opposite polarity to the polarity of the set pulse is applied to the variable resistance element to change the variable resistance element from the low resistance state to the high resistance state. In the training operation, the set pulse and the reset pulse are continuously applied to the variable resistance element.

19 Claims, 8 Drawing Sheets

SEMICONDUCTOR STORAGE DEVICE AND DATA CONTROL METHOD THEREOF

CROSS-REFERENCE TO RELATED APPLICATIONS

This application is based upon and claims the benefit of priority from the prior Japanese Patent Application No. 2011-207869, filed on Sep. 22, 2011, the entire contents of which are incorporated herein by reference.

FIELD

The present embodiment relates to a semiconductor storage device and a data control method thereof.

BACKGROUND

In the conventional art, a resistance-change memory cell using a material whose resistance value is changed by application of a voltage has been proposed. The resistance-change memory cell has two types of operation modes (unipolar type and bipolar type). In the unipolar type operation mode, a voltage value and voltage application time are controlled without switching the polarity of an applied voltage, whereby the memory cell is transited between a high resistance state and a low resistance state. In the bipolar type operation mode, the memory cell is transited between the high resistance state and the low resistance state by switching the polarity of the applied voltage.

In the bipolar type operation mode, when the memory cell is placed in the low resistance state (set state), a set pulse is applied, and when the memory cell is placed in the high resistance state (reset state), a reset pulse having an opposite polarity to the polarity of the set pulse is applied. However, there is a memory cell whose transition to the set state or the reset state is unstable, although the set pulse or the reset pulse is applied thereto.

DETAILED DESCRIPTION

A semiconductor storage device according to an embodiment has a memory cell array and a control circuit. The memory cell array includes memory cells each including a variable resistance element. The memory cells are arranged at crossing portions between a plurality of first wirings and a plurality of second wirings. A control circuit is configured to apply a predetermined voltage to a selected first wiring and a second wiring to thereby apply a voltage to a memory cell disposed at the crossing portion between the selected first and second wirings. The control circuit executes a set operation, a reset operation, and a training operation. In the set operation, the set pulse is applied to the variable resistance element to change the variable resistance element from the high resistance state to the low resistance state. In the reset operation, a reset pulse having an opposite polarity to the polarity of the set pulse is applied to the variable resistance element to change the variable resistance element from the low resistance state to the high resistance state. In the training operation, the set pulse and the reset pulse are continuously applied to the variable resistance element.

Hereinafter, a semiconductor storage device according to embodiments will be described with reference to the drawings.

First Embodiment

Figure 1:
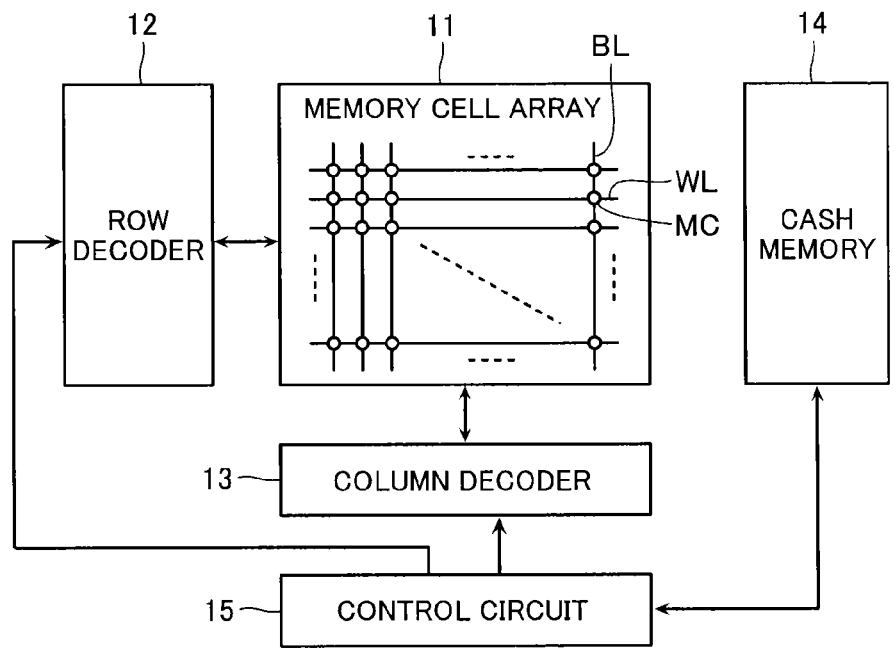
FIG. 1 is a block diagram of a semiconductor storage device according to a first embodiment.

FIG. 1 is a block diagram of a semiconductor storage device according to a first embodiment. The semiconductor storage device according to the first embodiment includes a memory cell array 11, a row decoder 12, a column decoder 13, a cash memory 14, and a control circuit 15, as shown in FIG. 1.

The memory cell array 11 has a plurality of word lines WL, a plurality of bit lines BL crossing the word lines WL, and memory cells MC arranged at the respective crossing portions between the bit lines BL and the word lines WL. The row decoder 12 selects the word line WL based on a row address and applies a voltage required for various operations to the word line WL. The column decoder 13 selects the bit line BL based on a column address and applies a voltage required for various operations to the bit line BL. Further, the column decoder 13 detects and amplifies a signal appearing at the bit line BL and determines data held by in memory cell MC.

The cash memory 14 storages the address of the memory cell MC requiring a training operation to be described later. Based on address and data input from outside, the control circuit 15 applies a row address to the row decoder 12 and applies a column address and data to the column decoder 13. Consequently, the control circuit 15 applies a predetermined voltage to the selected word line WL and the selected bit line BL and applies a voltage to the memory cell MC between the selected word line WL and the selected bit line BL. Further, the control circuit 15 reads out the address of the memory cell MC as a target of the training operation from the cash memory 14 and executes the training operation with respect to the memory cell MC located at the address.

Figure 2:
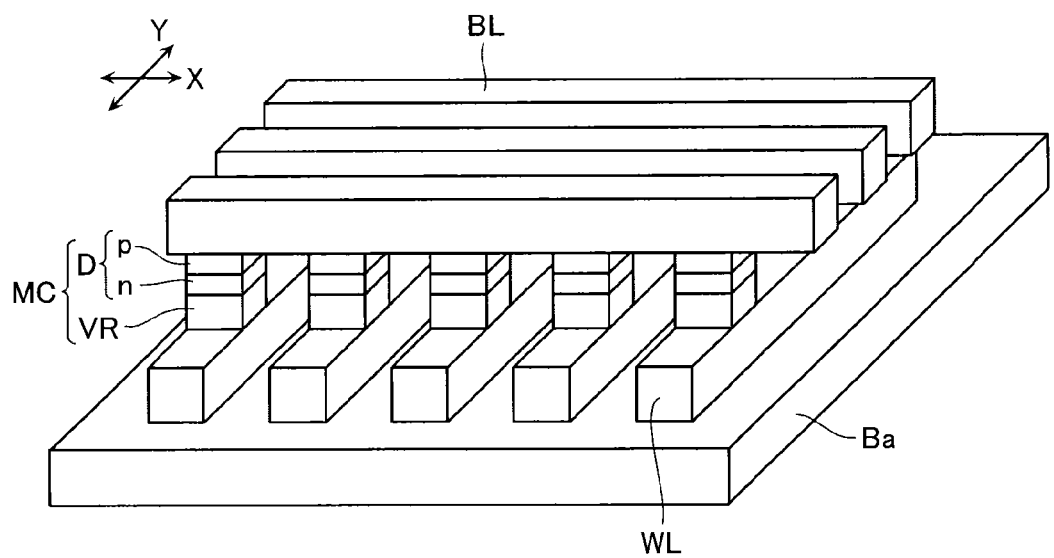
FIG. 2 is a perspective view showing a portion of a memory cell array 11 according to the first embodiment.

FIG. 2 is a perspective view showing a portion of the memory cell array 11. The word lines WL are arranged at a predetermined pitch in an X direction parallel to a semiconductor substrate Ba and extend in a Y direction. The bit lines BL are arranged at a predetermined pitch in the Y direction so as to cross the word lines WL and extend in the X direction. The memory cell MC is connected between the word line WL and the bit line BL at a portion where the word line WL and the bit line BL cross each other. The memory cell MC has a diode D and a variable resistance element VR connected in series. The forward direction of the diode D is a direction from the bit line BL to the word line WL, for example.

In the variable resistance element VR, in the bipolar type operation mode, the resistance state is transited between a low resistance state (set state) and a high resistance state (reset state). The variable resistance element VR can be transited from the high resistance state to the low resistance state by being subjected to application of a set pulse. Meanwhile, the variable resistance element VR can be transited from the low resistance state to the high resistance state by being subjected to application of a reset pulse having an opposite polarity to the polarity of the set pulse.

As the variable resistance element VR, PCRAM, CBRAM, ReRAM, and so on shown as follows can be used. The PCRAM changes its resistance value by phase transition between a crystalline state and an amorphous state, like chalcogenide or the like. CBRAM changes its resistance value by precipitating metal cations to form a contacting bridge between the electrodes and ionizing the precipitated metal to destroy the contacting bridge. ReRAM changes its resistance value by voltage or current application. ReRAM is broadly divided into ones in which resistance change occurs due to presence/absence of a trapped charge in a charge trap existing at an electrode interface and ones in which resistance change occurs due to presence/absence of a conductive path induced by oxygen deficiency or the like. In the case of ReRAM, $ZnMn_2O_4$, NiO, $TiO_2$, $SrZrO_3$, $Pr_{0.7}Ca_{0.3}MnO_3$, and so on can be used as the material.

Figure 3:
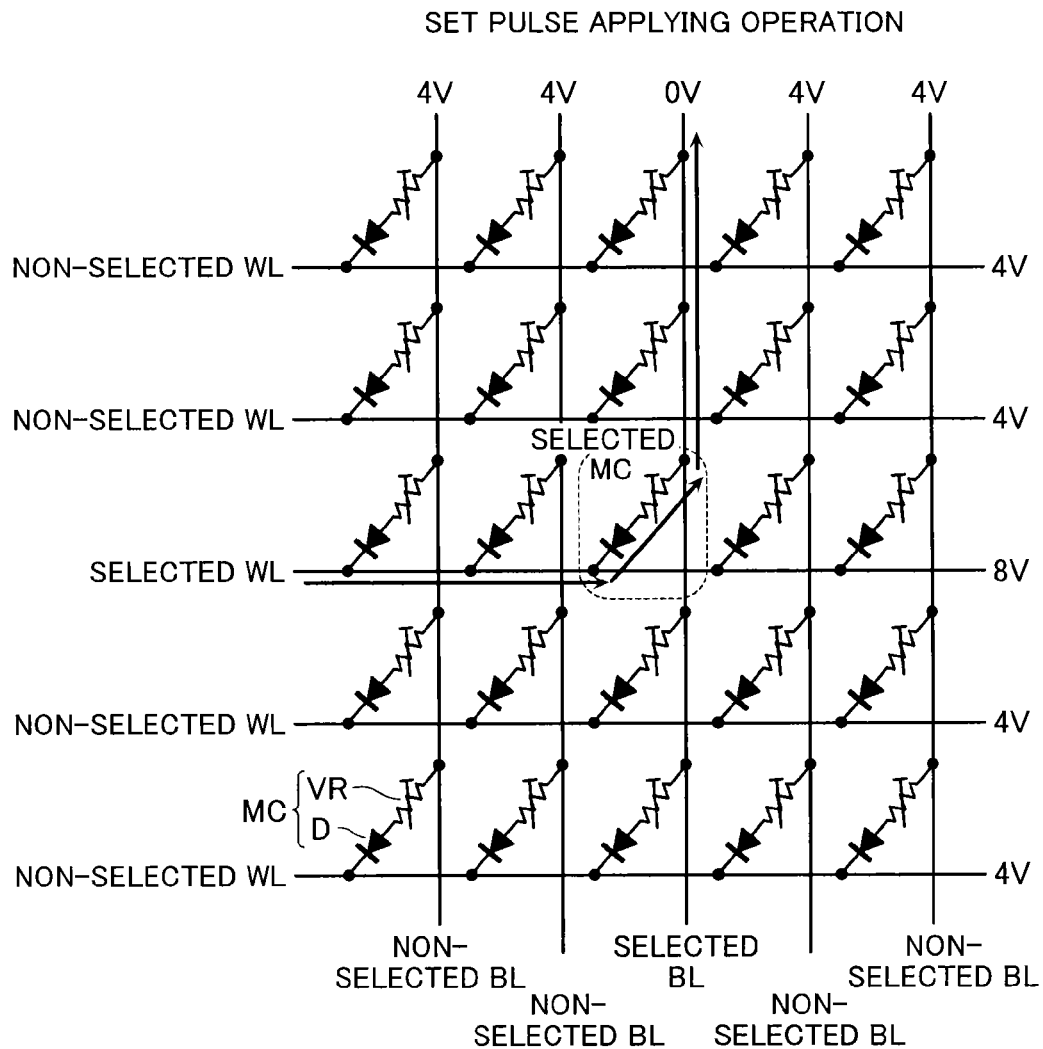
FIG. 3 is a schematic diagram showing a set pulse applying operation according to the first embodiment.
Figure 4:
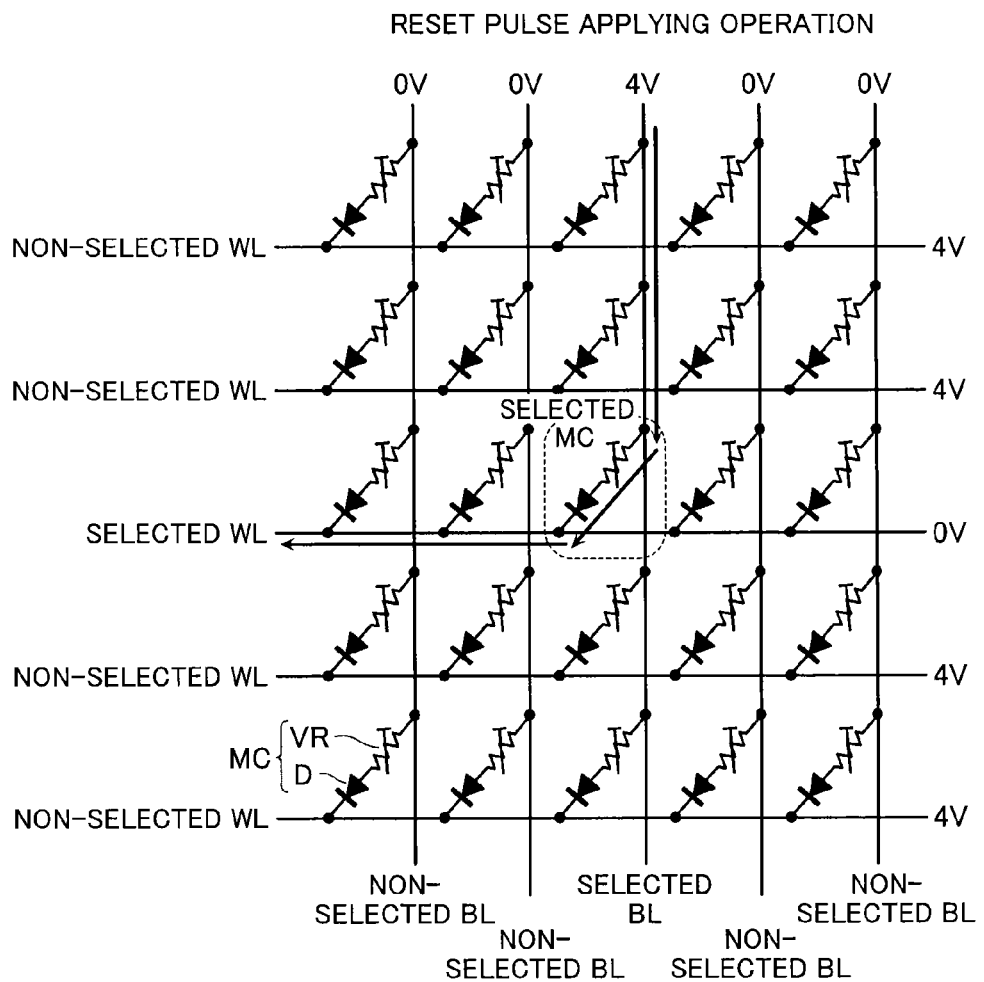
FIG. 4 is a schematic diagram showing a reset pulse applying operation according to the first embodiment.

FIGS. 3 and 4 are equivalent circuit diagrams of the memory cell array 11 shown in FIG. 2. FIG. 3 shows a set pulse applying operation, and FIG. 4 shows a reset pulse applying operation. First, the set pulse applying operation executed with respect to the memory cell MC will be described with reference to FIG. 3. The set pulse applying operation is executed to change the variable resistance element VR in the memory cell MC to be selected from the high resistance state to the low resistance state. In the set pulse applying operation, the control circuit 15 applies the set pulse to a selected memory cell MC. As shown in FIG. 3, in the set pulse applying operation, the voltage of a selected word line WL is set to 8 V, and the voltage of a non-selected word line WL is set to 4 V. The voltage of a selected bit line BL is set to 0 V, and the voltage of a non-selected bit line BL is set to 4 V. Accordingly, the set pulse of 8 V reaching the breakdown voltage of the diode D is applied to the selected memory cell MC in a reverse bias direction of the diode D. The variable resistance element VR in the selected memory cell MC can be transited from the high resistance state to the low resistance state by the set pulse.

Next, the reset pulse applying operation executed with respect to the memory cell MC will be described with reference to FIG. 4. The reset pulse applying operation is executed to change the variable resistance element VR in the selected memory cell MC from the low resistance state to the high resistance state. In the reset pulse applying operation, the control circuit 15 applies the reset pulse to the selected memory cell MC. As shown in FIG. 4, in the reset pulse applying operation, the voltage of the selected word line WL is set to 0 V, and the voltage of the non-selected word line WL is set to 4 V. The voltage of the selected bit line BL is set to 4 V, and the voltage of the non-selected bit line BL is set to 0 V. Accordingly, the reset pulse of 4 V is applied to the selected memory cell MC in a forward bias direction of the diode D. The variable resistance element VR in the selected memory cell MC can be transited from the low resistance state to the high resistance state by the reset pulse.

Next, the set operation, the reset operation, and the training operation executed with respect to the memory cell MC will be described. The set operation includes the set pulse applying operation and is an operation of transiting the variable resistance element VR from the high resistance state (reset state) to the low resistance state (set state). The reset operation includes the reset pulse applying operation and is an operation of transiting the variable resistance element VR from the low resistance state (set state) to the high resistance state (reset state). The training operation is executed after the set operation or the reset operation. In the training operation, the set pulse and the reset pulse are applied to the variable resistance element VR whose resistance value is not changed to a predetermined value by the set operation or the reset operation.

Figure 5:
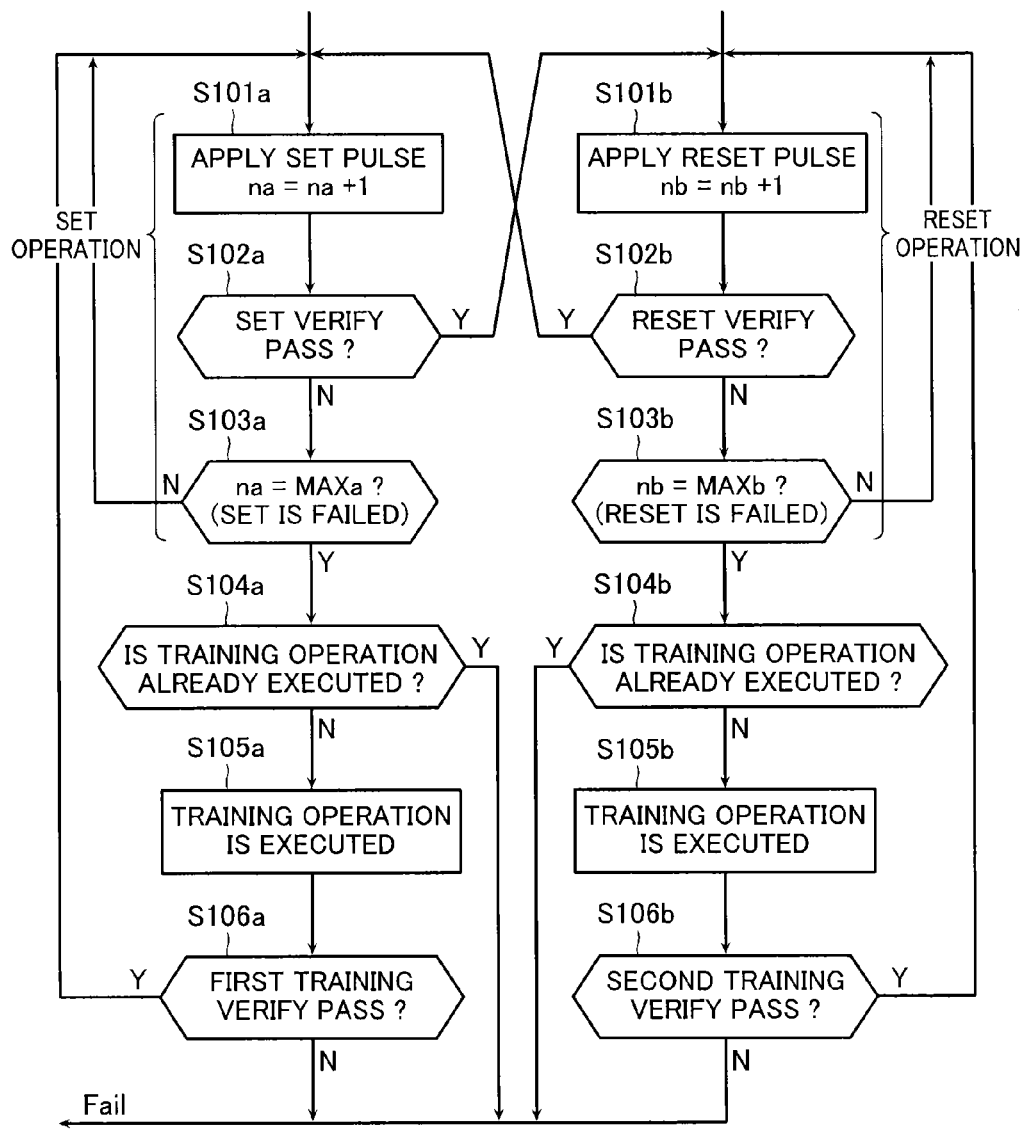
FIG. 5 is a flow chart showing a set operation, a reset operation, and a training operation according to the first embodiment.

A case where the set operation (S101a to 103a) is executed will be described with reference to FIG. 5. In the set operation, first, the set pulse is applied to the selected memory cell MC (set pulse applying operation), and, at the same time, a set pulse application frequency na is counted (S101a). Next, a set verify operation is executed (S102a). In the set verify operation, whether or not the variable resistance element VR in the selected memory cell MC is in the set state is judged. In the set verify operation, the set state is judged by whether or not the resistance value of the variable resistance element VR is not more than a resistance value LL. In the set verify operation, when it is determined that the variable resistance element VR is in the set state (S102a, Y), the reset operation (S101b to 103b) can be executed. Meanwhile, when it is determined that the variable resistance element VR is not in the set state (S102a, N), whether or not the set pulse application frequency na is a maximum frequency MAXa is determined (S103a). In step S103a, when the set pulse application frequency na is not the maximum frequency MAXa (S103a, N), step S101a is executed again. Meanwhile, when the set pulse application frequency na is the maximum frequency MAXa (S103a, Y), the set operation is completed, and step S104a is executed.

In step S104a, whether or not the training operation is already executed is determined. In step S104a, when it is determined that the training operation is already executed (S104a, Y), it is determined that the selected memory cell MC as a target of the set operation is defective (Fail). Meanwhile, when it is determined that the training operation is not executed yet (S104a, N), the training operation is executed (S105a). Subsequently, a first training verify operation is executed (S106a). In the first training verify operation, whether or not a first training operation for the variable resistance element VR in the selected memory cell MC is normally completed is determined. In the first training verify operation, when it is determined that the first training operation for the variable resistance element VR is normally completed (S106a, Y), step S101a is executed again. Meanwhile, when it is determined that the first training operation for the variable resistance element VR is not normally completed (S106a, N), it is determined that the selected memory cell MC as the target of the set operation is defective (Fail).

Next, a case where the reset operation (S101b to 103b) is executed will be described with reference to FIG. 5. In the reset operation, first, the reset pulse is applied to the selected memory cell MC (reset pulse applying operation) as shown in FIG. 5, and, at the same time, a reset pulse application frequency nb is counted (S101b). Next, a reset verify operation is executed (S102b). In the reset verify operation, whether or not the variable resistance element VR in the selected memory cell MC is in the reset state is judged. In the reset verify operation, the reset state is judged by whether or not the resistance value of the variable resistance element VR is not less than a resistance value LH. In the reset verify operation, when it is determined the variable resistance element VR is in the reset state (S102b, Y), the set operation (S101a to 103a)

can be executed. Meanwhile, when it is determined that the variable resistance element VR is not in the reset state (S102b, N), whether or not the reset pulse application frequency nb is a maximum frequency MAXb is determined (S103b). In step S103b, when the reset pulse application frequency nb is not the maximum frequency MAXb (S103b, N), step S101b is executed again. Meanwhile, when the reset pulse application frequency nb is the maximum frequency MAXb (S103b, Y), the reset operation is completed, and step S104b is executed.

In step S104b, whether or not the training operation is already executed is determined. In step S104b, when it is determined that the training operation is already executed (S104b, Y), it is determined that the selected memory cell MC as a target of the reset operation is defective (Fail). Meanwhile, when it is determined that the training operation is not executed yet (S104b, N), the training operation is executed (S105b). Subsequently, a second training verify operation is executed (S106b). In the second training verify operation, whether or not a second training operation for the variable resistance element VR in the selected memory cell MC is normally completed is determined. In the second training verify operation, when it is determined that the second training operation for the variable resistance element VR is normally completed (S106b, Y), step S101b is executed again. Meanwhile, when it is determined that the second training operation for the variable resistance element VR is not normally completed (S106b, N), it is determined that the selected memory cell MC as the target of the reset operation is defective (Fail).

Figure 6:
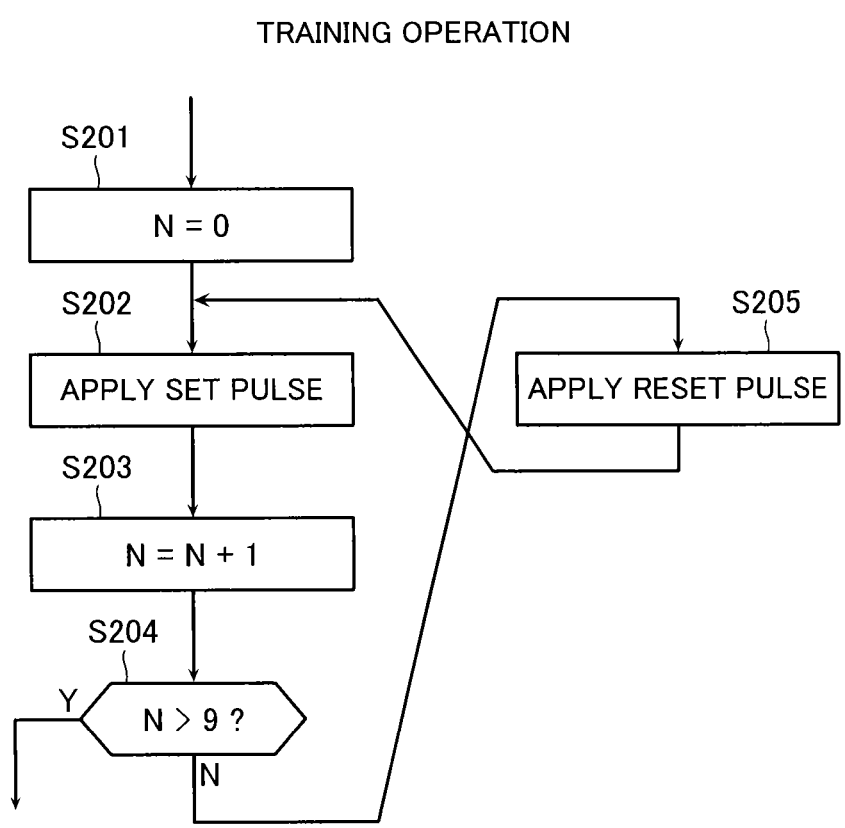
FIG. 6 is a flow chart showing the training operation according to the first embodiment.

Next, the training operation will be specifically described with reference to FIG. 6. As shown in FIG. 6, in the training operation, first of all, a frequency N is set to "0" (S201). The frequency N is the number of times of applying the set pulse and is set to 5 to 20 times according to the characteristics of the variable resistance element VR. In this example, it is set so that N=9. Next, the set pulse is applied to the selected memory cell MC (S202), and "1" is added to the frequency N (S203). Subsequently, whether or not the frequency N is more than "9" is determined (S204). When it is determined that the frequency N is not more than "9" (S204, N), the reset pulse is applied to the selected memory cell MC (S205), and step S202 is then executed again. Meanwhile, when it is determined that the frequency N is more than "9" in step S204 (S204, Y), the training operation is completed. According to this constitution, the set pulse and the reset pulse are alternately applied to the variable resistance element VR nine times. Whether or not the first training operation and the second training operation are normally completed may be determined with reference to whether or not the resistance value reaches verify levels LL' and LH' looser than set and verify levels LL and LH.

Figure 7:
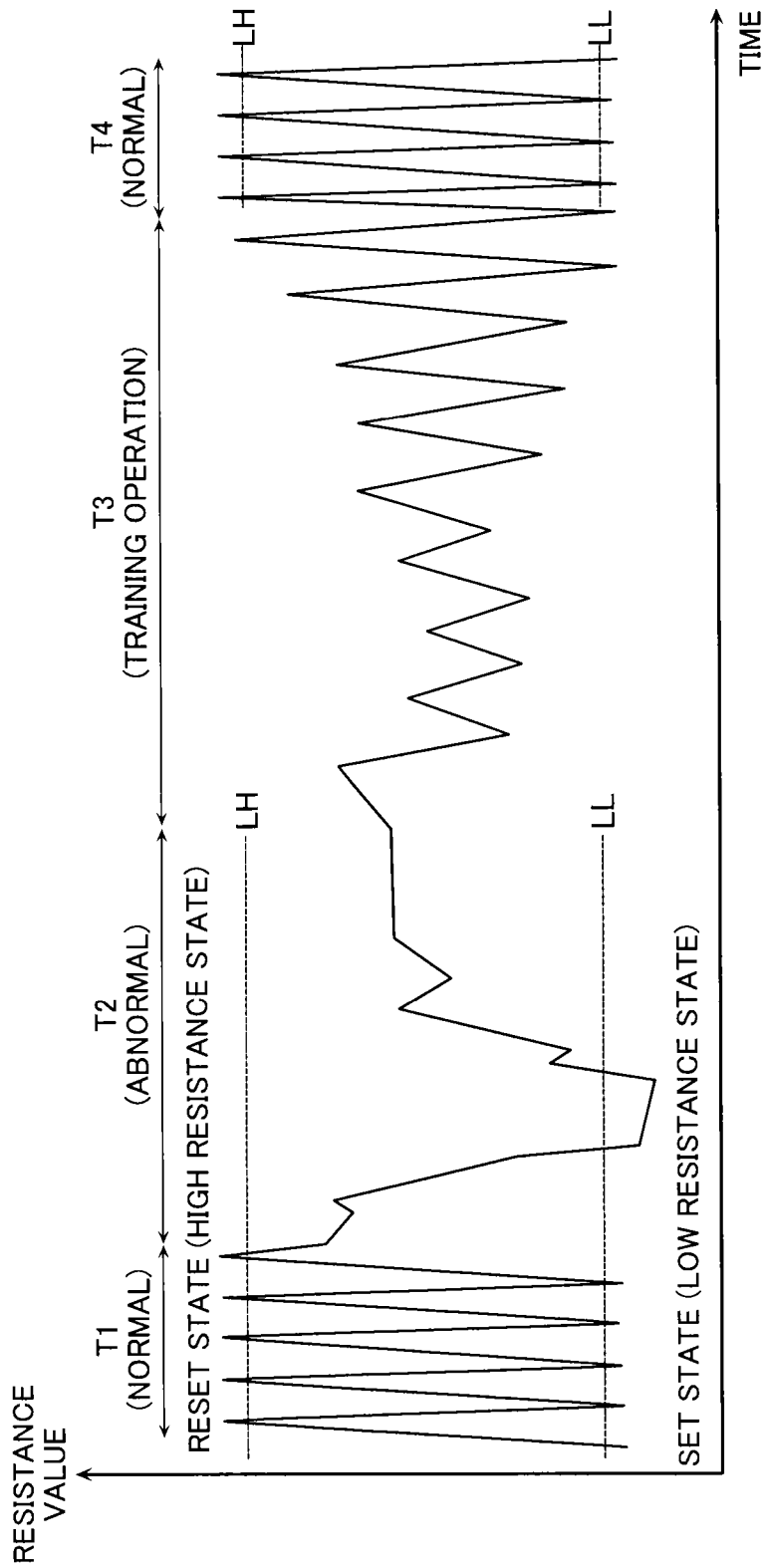
FIG. 7 is a view showing a change of a resistance value of a variable resistance element VR by the training operation according to the first embodiment.

Next, a change of the resistance value of the variable resistance element VR by the training operation will be described with reference to FIG. 7. In the example shown in FIG. 7, in a period of time T1, the variable resistance element VR maintains a normal state transited to the low resistance state (set state) not more than the resistance value LL or the high resistance state (reset state) not less than the resistance value LH by one or several times of the set pulse or reset pulse.

However, when the set operation and the reset operation are repeated in the period of time T1, the variable resistance element VR may be placed in an abnormal state in which the variable resistance element VR is not easily changed to the low resistance state or the high resistance state in a period of time T2. An example shown in FIG. 7 shows a state in which the variable resistance element VR finally does not transit to the high resistance state (reset state) in the period of time T2.

Even in such a state, the variable resistance element VR may be returned to the normal state again by plural times of alternate application of the set pulse and the reset pulse. Thus, in the present embodiment, the above training operation is performed in a period of time T3. Consequently, in the training operation, the set pulse and the reset pulse are alternately applied to the variable resistance element VR a predetermined number of times. In a period of time T4, the variable resistance element VR may be placed in a state capable of transiting to the high resistance state and the low resistance state. The voltage applied in the training operation is the set pulse or the reset pulse, and a new pulse is not required in the training operation.

Second Embodiment

Next, a training operation of a semiconductor storage device according to a second embodiment will be described with reference to FIG. 8. The second embodiment is different from the first embodiment in only the training operation. In the second embodiment, descriptions of the configurations similar to those of the first embodiment are omitted.

In the training operation according to the second embodiment, first and second training verify operations are executed in the training operation. In the first and second training verify operations, verify levels LH' and LL' with a resistance value more than a set verify level LL and less than a reset verify level LH are regarded as determining levels.

Figure 8:
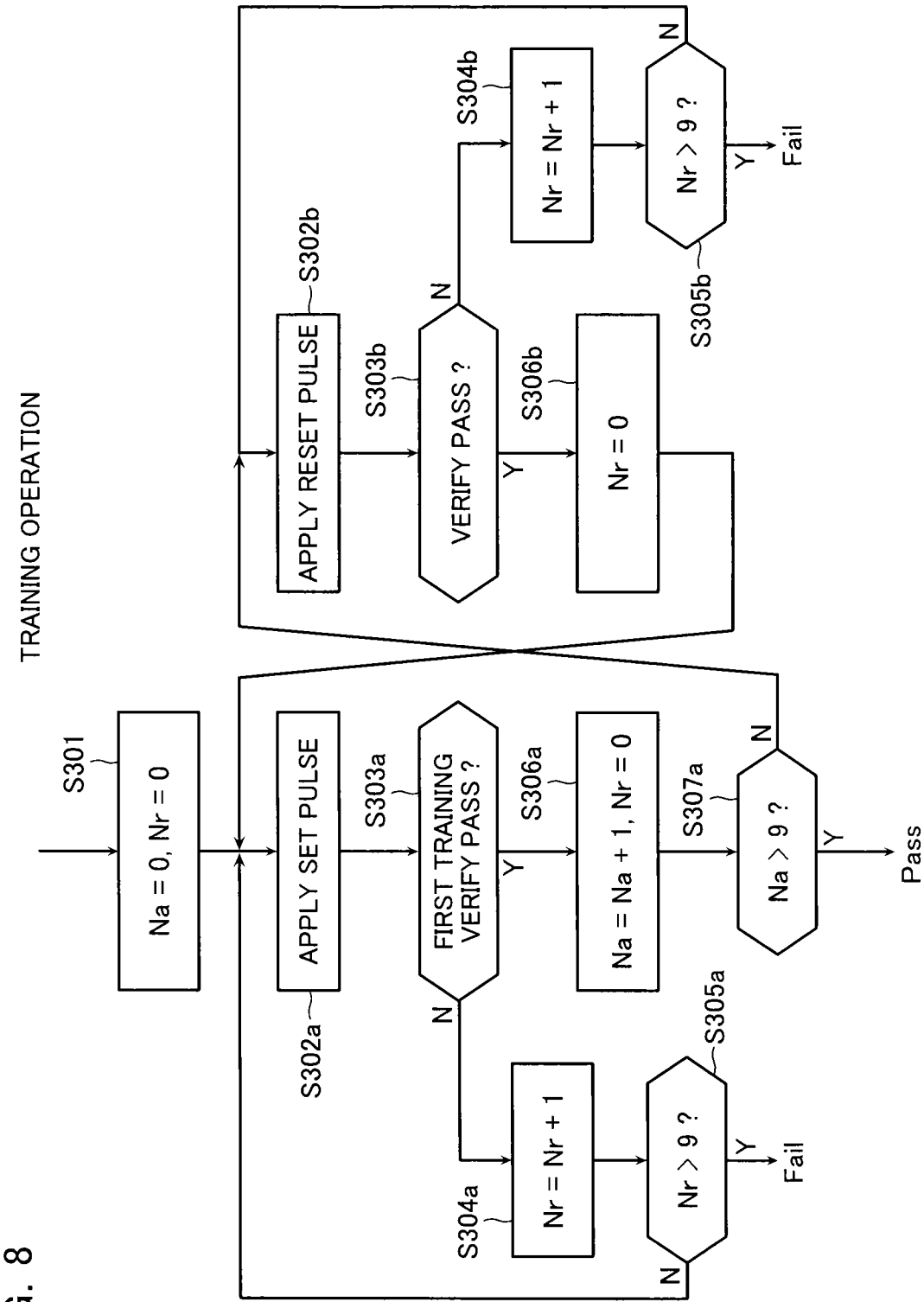
FIG. 8 is a flow chart showing a training operation according to a second embodiment.

As shown in FIG. 8, in the training operation according to the second embodiment, the frequencies Na and Nr are first set to "0" (S301). The frequency Na is a frequency that it is determined as pass in the first training verify operation. The frequency Nr is the number of times of the set pulse applied continuously without interposing the reset pulse or the number of times of the reset pulse applied continuously without interposing the set pulse.

After step S301, the set pulse is applied to the selected memory cell MC (S302a). Subsequently, the first training verify operation is executed with respect to the selected memory cell MC (S303a).

In step S303a, when it is determined that the resistance value of the variable resistance element VR is not no more than the resistance value LL' (S303a, N), "1" is added to the frequency Nr (S304a). After that, whether or not the frequency Nr is more than "9" is determined (S305a). In step S305a, when it is determined that the frequency Nr is more than "9" (S305a, Y), it is determined that the selected memory cell MC is defective (Fail). Meanwhile, when it is determined that the frequency Nr is not more than "9" (S305a, N), step S302a is executed again.

In step S303a, when it is determined that the resistance value of the variable resistance element VR is not more than the resistance value LL' (S303a, Y), "1" is added to the frequency Na, and the frequency Nr is set to "0" (S306a). Subsequently, whether or not the frequency Na is more than "9" is determined (S307a). In step S307a, when it is determined that the frequency Na is more than "9" (S307, Y), it is determined that the training operation is normally executed, and the training operation is completed (Pass). Meanwhile, when it is determined that the frequency Na is not more than "9" (S307, N), the following step S302b is executed.

In step S302b, the reset pulse is applied to the selected memory cell MC. Then, the second training verify operation is executed (S303b).

In step S303b, when it is determined that the resistance value of the variable resistance element VR is not no less than the resistance value LH' (S303b, N), "1" is added to the frequency Nr (S304b), and after that, whether or not the frequency Nr is more than "9" is determined (S305b). In step S305b, when it is determined that the frequency Nr is more than "9" (S305b, Y), it is determined that the selected memory cell MC is defective (Fail). Meanwhile, when it is determined that the frequency Nr is not more than "9" (S305b, N), step S302b is executed again.

In step S303b, when it is determined that the resistance value of the variable resistance element VR is not less than the resistance value LH' (S303b, Y), the frequency Nr is set to "0" (S306b). Subsequently, step S302a is executed again.

Figure 9:
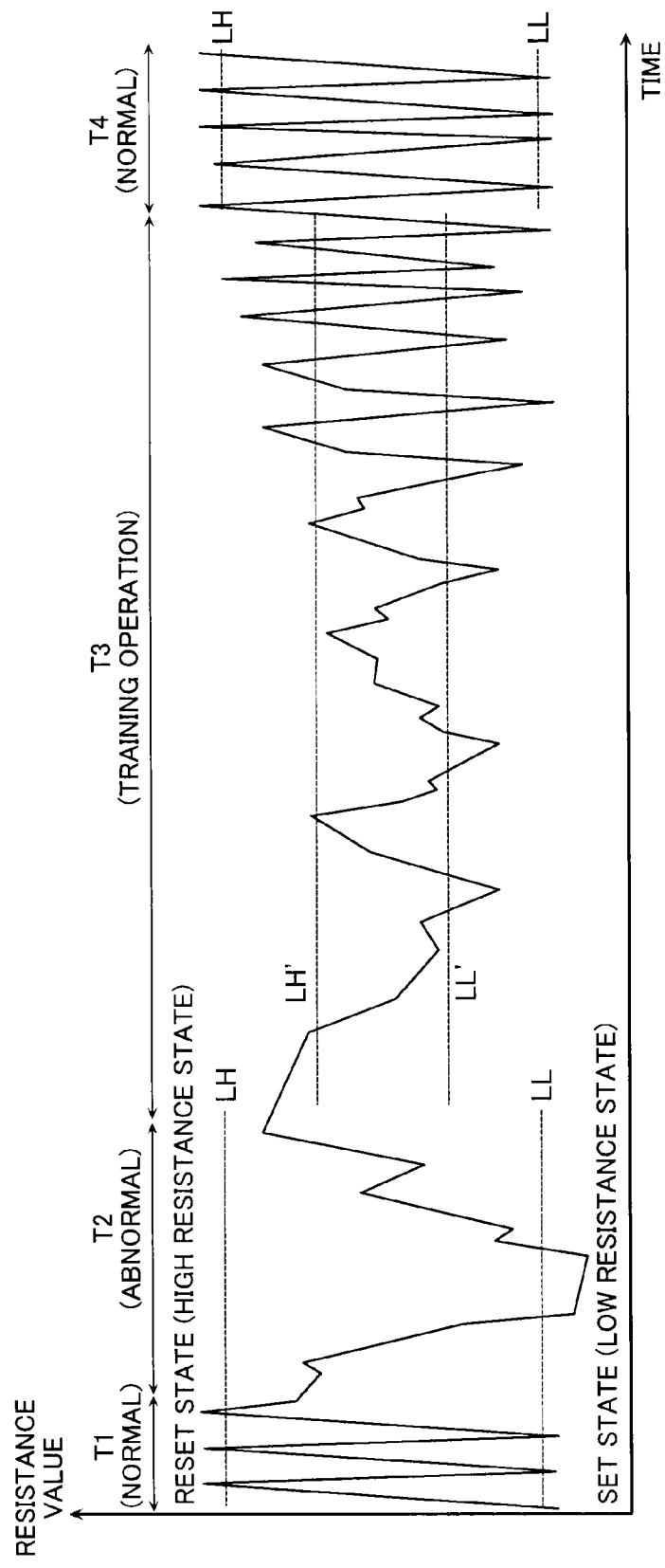
FIG. 9 is a view showing a change of a resistance value of a variable resistance element VR by the training operation according to the second embodiment.

Next, a change of the resistance value of the variable resistance element VR by the training operation will be described with reference to FIG. 9. In the example shown in FIG. 9, in a period of time T1, the variable resistance element VR transits to the low resistance state (set state) not more than the resistance value LL or the high resistance state (reset state) not less than the resistance value LH by one or several times of the set pulse or reset pulse.

However, when the set operation and the reset operation are repeated in the period of time T1, the variable resistance element VR may be placed in the abnormal state in which the variable resistance element VR is not easily changed to the low resistance state or the high resistance state in a period of time T2. An example shown in FIG. 9 shows a state in which the variable resistance element VR finally does not transit to the high resistance state (reset state) in the period of time T2. Thus, in the present embodiment, the above training operation is performed in a period of time T3. Consequently, in the training operation, the set pulse and the reset pulse are applied to the variable resistance element VR, and, at the same time, the first and second training verify operations (LL' and LH') are performed. In a predetermined number of times of the first training verify operation, when it is determined that the resistance value of the variable resistance element VR is not more than the resistance value LL', the variable resistance element VR is in a state capable of transiting the high resistance state and the low resistance state in a period of time T4 subsequent to the time T3.

In the second embodiment, since the first and second training verify operations are repeatedly executed, the execution of the training operation requires a longer time than that in the first embodiment. However, in the second embodiment, the state of the variable resistance element VR can be returned to a usual state more reliably than that in the first embodiment.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the first and second embodiments, the training operation is executed continuously with the set operation or the reset operation when set failure or reset failure occurs. However, the training operation may be executed based on information of the cash memory 14 in a standby state in which command of the set operation and the reset operation is not received. The training operation may be executed associated with the set operation or the reset operation regardless of the set failure and the reset failure.

What is claimed is:

1. A semiconductor storage device comprising:
a memory cell array comprising memory cells each including a variable resistance element, the memory cells arranged at crossing portions between a plurality of first wirings and a plurality of second wirings; and
a control circuit configured to apply a predetermined voltage to a selected first wiring and a selected second wiring to thereby apply a voltage to a memory cell disposed at a crossing portion between the selected first wiring and the selected second wiring,
the control circuit executing:
a set operation of applying a set pulse to the variable resistance element to change the variable resistance element from a high resistance state to a low resistance state;
a reset operation of applying a reset pulse to the variable resistance element to change the variable resistance element from the low resistance state to the high resistance state, the reset pulse having an opposite polarity to the polarity of the set pulse; and
a training operation of continuously applying the set pulse and the reset pulse to the variable resistance element.

2. The semiconductor storage device according to claim 1, wherein in the training operation, the set pulse and the reset pulse are alternately applied to the variable resistance element.

3. The semiconductor storage device according to claim 1, wherein the training operation comprises:
a first verify operation for determining whether or not a resistance value of the variable resistance element is changed to not more than a first resistance value; and
a second verify operation for determining whether or not the resistance value of the variable resistance element is changed to not less than a second resistance value,
in the training operation, after it is determined that the resistance value of the variable resistance element is not more than the first resistance value in the first verify operation, the reset pulse is applied to the variable resistance element, and after it is determined that the resistance value of the variable resistance element is not less than the second resistance value in the second verify operation, the set pulse is applied to the variable resistance element.

4. The semiconductor storage device according to claim 3, wherein
the set operation includes a set verify operation for determining whether or not the variable resistance element is changed to the low resistance state not more than a third resistance value,
the reset operation includes a reset verify operation for determining whether or not the variable resistance element is changed to the high resistance state not less than a fourth resistance value,
the third resistance value is less than the first resistance value, and
the fourth resistance value is more than the second resistance value.

5. The semiconductor storage device according to claim 1, wherein the control circuit executes the training operation in a standby state in which command of the set operation and the reset operation is not received.

6. The semiconductor storage device according to claim 1, wherein the control circuit executes the training operation when the set operation and the reset operation are failed.

7. The semiconductor storage device according to claim 1, wherein the control circuit executes the training operation when the set operation or the reset operation reaches a maximum frequency and is failed.

8. The semiconductor storage device according to claim 1, wherein the control circuit executes the training operation associated with the set operation or the reset operation.

9. The semiconductor storage device according to claim 2, wherein the training operation is completed after the set pulse is repeatedly applied to the variable resistance element a predetermined number of times.

10. The semiconductor storage device according to claim 1, wherein each of the memory cells comprises a rectifying device series-connected to the variable resistance element.

11. The semiconductor storage device according to claim 10, wherein the set pulse is applied in a reverse bias direction of the rectifying device, and the reset pulse is applied in a forward bias direction of the rectifying device.

12. The semiconductor storage device according to claim 1, wherein the control circuit determines whether or not the training operation is normally executed.

13. The semiconductor storage device according to claim 1, further comprising a cash memory storing an address of the memory cell requiring the training operation.

14. A data control method of a semiconductor storage device, the semiconductor storage device comprising a memory cell array comprising memory cells each including a variable resistance element, the memory cells arranged at crossing portions between a plurality of first wirings and a plurality of second wirings, the method comprising:
applying a predetermined voltage to a selected first wiring and a selected second wiring to thereby apply a voltage to a memory cell disposed at a crossing portion between the selected first wiring and the selected second wiring;
executing a set operation for applying a set pulse to the variable resistance element to change the variable resistance element from a high resistance state to a low resistance state:
executing a reset operation for applying a reset pulse to the variable resistance element to change the variable resistance element from the low resistance state to the high resistance state, the reset pulse having an opposite polarity to the polarity of the set pulse; and
executing a training operation for continuously applying the set pulse and the reset pulse to the variable resistance element.

15. The data control method of a semiconductor storage device, according to claim 14, wherein in the training operation, the set pulse and the reset pulse are alternately applied to the variable resistance element.

16. The data control method of a semiconductor storage device, according to claim 14, wherein the training operation comprises:
a first verify operation for determining whether or not a resistance value of the variable resistance element is changed to not more than a first resistance value; and
a second verify operation for determining whether or not the resistance value of the variable resistance element is changed to not less than a second resistance value,
in the training operation, after it is determined that the resistance value of the variable resistance element is not more than the first resistance value in the first verify operation, the reset pulse is applied to the variable resistance element, and after it is determined that the resistance value of the variable resistance element is not less than the second resistance value in the second verify operation, the set pulse is applied to the variable resistance element.

17. The data control method of a semiconductor storage device, according to claim 16, wherein
the set operation includes a set verify operation for determining whether or not the variable resistance element is changed to the low resistance state not more than a third resistance value,
the reset operation includes a reset verify operation for determining whether or not the variable resistance element is changed to the high resistance state not less than a fourth resistance value,
the third resistance value is less than the first resistance value, and
the fourth resistance value is more than the second resistance value.

18. The data control method of a semiconductor storage device, according to claim 14, wherein the step of executing the training operation is performed in a standby state in which command of the set operation and the reset operation is not received.

19. The data control method of a semiconductor storage device, according to claim 14, wherein the step of executing the training operation is performed when the set operation and the reset operation are failed.

* * * * *